(12) United States Patent
Chao et al.

(10) Patent No.: US 11,353,483 B2
(45) Date of Patent: Jun. 7, 2022

(54) SENSOR WITH COMPENSATION CIRCUIT (71) Applicant: HYCON TECHNOLOGY CORP., Taipei (TW)

(72) Inventors: Po-Yin Chao, Taipei (TW); Hung-Wei Chen, Taipei (TW); Shui-Chu Lee, Taipei (TW)

(73) Assignee: HYCON TECHNOLOGY CORP., Taipei (TW)

( * ) Notice: Subject to any disclaimer, the term of this patent is extended or adjusted under 35 U.S.C. 154(b) by 586 days.

(21) Appl. No.: 16/357,427

(22) Filed: Mar. 19, 2019

(65) Prior Publication Data

US 2020/0300897 A1 Sep. 24, 2020

(51) Int. Cl.
*G01R 17/12* (2006.01)
*G01D 3/036* (2006.01)
*H03M 1/00* (2006.01)
*G01D 3/02* (2006.01)
*G01R 31/50* (2020.01)

(52) U.S. Cl.
CPC ............. *G01R 17/12* (2013.01); *G01D 3/02* (2013.01); *G01R 31/50* (2020.01); *H03M 1/001* (2013.01)

(58) Field of Classification Search
CPC .......... G01R 17/12; G01R 31/50; G01D 3/02; G01D 3/036; H03M 1/001
See application file for complete search history.

(56) References Cited

PUBLICATIONS

Nagarajan et al., An Improved Direct Digital Converter for Bridge-Connected Resistive Sensors, May 15, 2016, IEEE Sensors Journal, vol. 16, No. 10, pp. 3679-3688 (Year: 2016).*

* cited by examiner

*Primary Examiner* — Toan M Le
(74) *Attorney, Agent, or Firm* — Demian K. Jackson; Jackson IPG PLLC (57) ABSTRACT

Disclosed is a sensor with compensation circuit for compensating offset by use of a switching circuit. The sensor has two operation modes for generating two output voltages, respectively. Offset is compensated by adding the two output voltages, and magnitude of the offset is calculated by subtracting the two output voltages. A noise threshold is set for checking if the circuit is affected by interference. When the circuit is affected by interference, the adding result of the two output voltages will be larger than the noise threshold, the output data will be hold and not updated, then a reminding signal will be issued to show that the circuit is affected by interference, and the output data flickers on a display unit when the adding result of the two output voltages is larger than the noise threshold for showing the circuit is affected by interference.

24 Claims, 7 Drawing Sheets

SENSOR WITH COMPENSATION CIRCUIT

FIELD OF THE INVENTION

The present invention relates to a sensor with compensation circuit, and more particularly to a bridge sensor with compensation circuit to compensate the offset of the sensor or circuit.

BACKGROUND OF THE INVENTION

Bridge sensor is widely used in various electronic components, such as pressure sensor, tension sensor, and gravity sensor. They usually use low noise amplifier and analog-to-digital converter to convert voltage or current into digital output. However, there are some non-ideal effects in the circuit of sensor. For example, leakage currents of the components and wires and offsets of low noise amplifier and analog-to-digital converter all affect the accuracy of sensor.

Taiwan patent no. 1515413 discloses a detection circuit of bridge sensor, which compromises an amplify circuit, a rechargeable unit and a process unit. The process unit controls the charging period and the discharging period of the rechargeable unit, and calculates the output voltage by a charge balance equation, then the accuracy of the bridge sensor is improved. However, offset of the bridge sensor is not detected and compensated, and the detection circuit requires an accurate reference voltage and a timing counter to improve the accuracy.

U.S. Pat. No. 9,726,705 discloses an architecture of adding two switches at two input voltages of the bridge sensor. The operation method is turning on a switch and turning off the other switch, and measuring the output voltage two times. Then the effect of leakage current is detected by comparing the two output voltages. However, the operation method is only used to detect the leakage current, and cannot measure the signal at the same time.

SUMMARY OF THE INVENTION

The present invention discloses a sensor with compensation circuit, comprising a sensor, four switches and an amplifier. The sensor comprises a first input, a second input, a first output and a second output. The first switch is connected between a first power source and the first input. The second switch is connected between the first power source and the second input. The third switch is connected between a second power source and the first input. The fourth switch is connected between the second power source and the second input. The amplifier has a positive amplifier input and a negative amplifier input, separately connected to the first output and the second output. In addition, the voltage of an amplifier output is generated according to the voltage difference between the positive amplifier input and the negative amplifier input and multiplied by a gain.

The control method of the sensor with compensation circuit includes two operation modes: a first operation mode and a second operation mode. The first operation mode conducts the first switch and the fourth switch, turns off the second switch and the third switch. Hence, the first power source is connected to the first input, and the second power source is connected to the second input. The second operation mode conducts the second switch and the third switch, turns off the first switch and the fourth switch. Hence, the first power source is connected to the second input, and the second power source is connected to the first input. The offset of the amplifier can be cancelled by subtracting the voltages of the amplifier output generated in the first operation mode and the second operation mode. Additionally, the leakage current of the wire between the sensor and the amplifier is also compensated. Furthermore, the magnitude of offset can be calculated by the adding result of the voltages of the amplifier output generated in the first operation mode and the second operation mode.

The above sensor with compensation circuit further comprises an analog-to-digital converter for converting the voltage of the amplifier output into a digital data, and a calculation circuit for calculating the digital data generated in the first operation mode and the second operation mode. In addition, an output data is generated by subtracting the voltages of the amplifier output generated in the first operation mode and the second operation mode and then divide the difference by 2, or for generating an output data according to the voltage of the amplifier output generated in the first operation mode.

In the above sensor with compensation circuit, when the sensor or compensation circuit is affected by interference, such as shaking or noise interference, the adding result is larger than a normal value, and the output data is also affected by interference. Therefore, a noise threshold is set to check the circuit is affected by interference if the adding result is larger than the noise threshold, and the output data is hold and not updated.

In the above sensor with compensation circuit, wherein the noise threshold is a default value, or based on the adding result of the voltages of the amplifier output generated in the first operation mode and the second operation mode.

The above sensor with compensation circuit further comprises a reminding signal, used to show the circuit is affected by interference when the adding result of the voltages of the amplifier output generated in the first operation mode and the second operation mode is larger than the noise threshold.

The above sensor with compensation circuit further comprises a display unit for showing the output data. When the adding result of the voltages of the amplifier output generated in the first operation mode and the second operation mode is larger than the noise threshold, the output data flickers on the display unit or the reminding signal is shown on the display unit for representing the circuit is affected by interference.

The present invention discloses another sensor with compensation circuit, comprising a sensor, four switches and an amplifier. The sensor comprises a first input, a second input, a first output and a second output. A first power source connects to the first input, and a second power source connects to the second input. The first switch connects between the first output and positive amplifier input. The second switch connects between the first output and the negative amplifier input. The third switch connects between the second output and positive amplifier input. The fourth switch connects between the second output and the negative amplifier input. In addition, the voltage of the amplifier output is generated according to the voltage difference between the positive amplifier input and the negative amplifier input and multiplied by a gain.

The above sensor with compensation circuit comprises two operation modes: a first operation mode and a second operation mode. The first operation mode conducts the first switch and the fourth switch, turns off the second switch and the third switch. Hence, the first output is connected to the positive amplifier input, and the second output is connected to the negative amplifier input. The second operation mode conducts the second switch and the third switch, turns off the first switch and the fourth switch. Hence, the first output is connected to the negative amplifier input, and the second output is connected to the positive amplifier input. The offset of the amplifier can be cancelled by subtracting the voltages of the amplifier output generated in the first operation mode and the second operation mode. Furthermore, the magnitude of offset can be calculated by the adding result of the voltages of the amplifier output generated in the first operation mode and the second operation mode.

The above sensor with compensation circuit further comprises an analog-to-digital converter converting the voltage of the amplifier output to a digital data, and a calculation circuit calculating the digital data generated in the first operation mode and the second operation mode. In addition, an output data is generated by subtracting the voltages of the amplifier output generated in the first operation mode and the second operation mode and divided by 2, or generated by the amplifier output generated in the first operation mode.

In the above sensor with compensation circuit, when the sensor or compensation circuit is affected by interference, such as shaking or noise interference, the adding result is larger than a normal value, and the output data is also affected by interference. Therefore, a noise threshold is set to check the circuit is affected by interference if the adding result is larger than the noise threshold, and the output data is hold and not updated.

In the above sensor with compensation circuit, wherein the noise threshold is a default value, or based on the adding result of the voltages of the amplifier output generated in the first operation mode and the second operation mode.

The above sensor with compensation circuit further comprises a reminding signal, used to show the circuit is affected by interference when the adding result of the voltages of the amplifier output generated in the first operation mode and the second operation mode is larger than the noise threshold.

The above sensor with compensation circuit further comprises a display unit for showing the output data. When the adding result of the voltages of the amplifier output generated in the first operation mode and the second operation mode is larger than the noise threshold, the output data flickers on the display unit or the reminding signal is shown on the display unit for representing the circuit is affected by interference.

For the sensor with compensation circuits mentioned above, the voltage of the amplifier output equals to a voltage difference between the positive amplifier input and the negative amplifier input, and multiplied by a gain (K). Mathematical expression is "VOUT+=K*(VIN+−VIN−)". The amplifier may further comprise a negative amplifier output. The voltage difference between the amplifier output and the negative amplifier output equals to that between the positive amplifier input and the negative amplifier input, multiplied by a gain (K). Mathematical expression is "VOUT+−VOUT−=K*(VIN+−VIN−)".

For the sensor with compensation circuits mentioned above, wherein the sensor is a bridge sensor comprising four resistors. Wherein the first resistor connects between the first input and the first output. The second resistor connects between the second input and the first output. The third resistor connects between the first input and the second output. The fourth resistor connects between the second input and the second output.

This paragraph extracts and compiles some features of the present invention; other features will be disclosed in the follow-up paragraphs. It is intended to cover various modifications and similar arrangements included within the spirit and scope of the appended claims.

DETAILED DESCRIPTION OF THE PREFERRED EMBODIMENTS

The present invention will now be described more specifically with reference to the following embodiments. Please note that the following description of embodiments of the invention is intended to be merely illustrative. This is not meant to be an exhaustive description of the invention or limited to the form of the disclosure.

Figure 1:
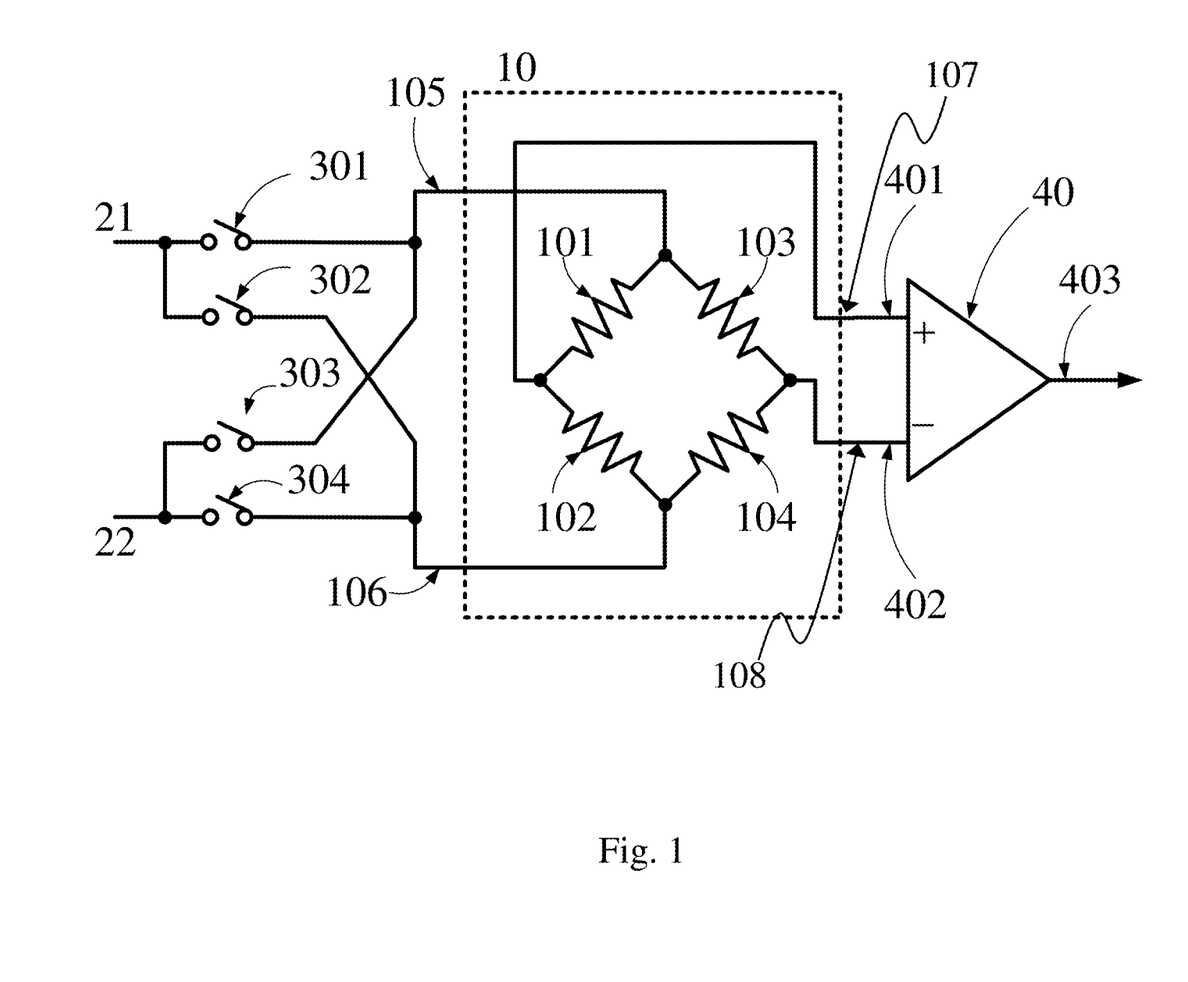
FIG. 1 illustrates an architecture of sensor with compensation circuit according to a first embodiment of the present invention.

A first embodiment of the present invention is disclosed in FIG. 1. It shows a sensor with compensation circuit. The sensor with compensation circuit comprises a sensor 10, four switches and an amplifier 40. The sensor 10 comprises a first input 105, a second input 106, a first output 107 and a second output 108. The first switch 301 connects between the first power source 21 and the first input 105. The second switch 302 connects between the first power source 21 and the second input 106. The third switch 303 connects between the second power source 22 and the first input 105. The fourth switch 304 connects between the second power source 22 and the second input 106. The amplifier 40 has a positive amplifier input 401 and a negative amplifier input 402, separately connected to the first output 107 and the second output 108. In other words, the first output 107 can either be connected to the positive amplifier input 401 or the negative amplifier input 402, and so does the second output 108. For example, the second output 108 is connected to the positive amplifier input 401 while the first output 107 is connected to the negative amplifier input 402; and the second output 108 is connected to the negative amplifier input 402 while the first output 107 is connected to the positive amplifier input 401. In addition, the voltage of the amplifier output 403 is generated by the voltage difference between the positive amplifier input 401 and the negative amplifier input 402 and multiplied by a gain.

For the sensor with compensation circuits mentioned above, wherein the sensor 10 is a bridge sensor comprising four resistors. Wherein the first resistor 101 connects between the first input 105 and the first output 107. The second resistor 102 connects between the second input 106 and the first output 107. The third resistor 103 connects between the first input 105 and the second output 108. The fourth resistor 104 connects between the second input 106 and the second output 108.

Figure 2A:
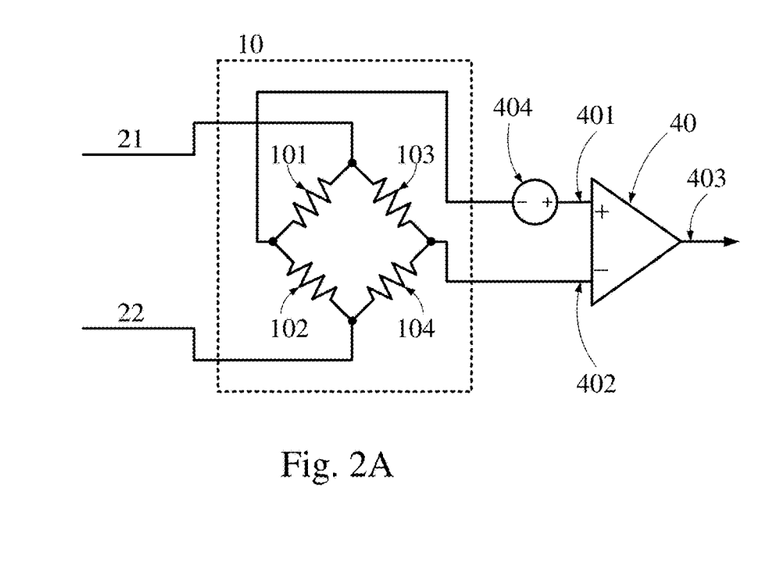
FIG. 2A and FIG. 2B illustrate an operation method for sensor with compensation circuit in FIG. 1.
Figure 2B:
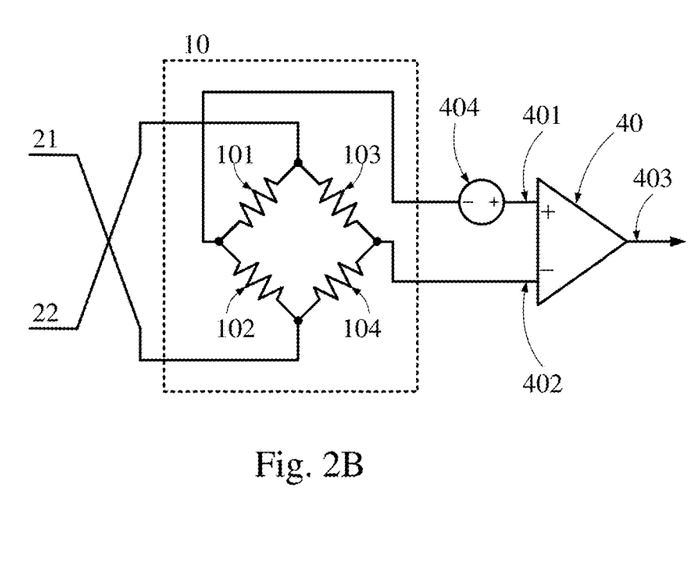

The sensor with compensation circuit comprises two operation modes: a first operation mode and a second operation mode. An equivalent circuit diagram of the first operation mode is shown in FIG. 2A. The first operation mode conducts the first switch 301 and the fourth switch 304, turns off the second switch 302 and the third switch 303. Hence, the first power source 21 is connected to the first input 105, and the second power source 22 is connected to the second input 106. An equivalent circuit diagram of the second operation mode of the sensor with compensation circuit is shown in FIG. 2B. The second operation mode conducts the second switch 302 and the third switch 303, turns off the first switch 301 and the fourth switch 304. Hence, the first power source 21 is connected to the second input 106, and the second power source 22 is connected to the first input 105.

Assuming the voltage difference of the first power source 21 and the second power source 22 is Vin, and the resistance of the first resister 101, the second resistor 102, and the third resistor 103 in the bridge sensor 10 is R1, and the resistance of the fourth resistor 104 is R2, the voltage of the amplifier offset 404 is Vos, the gain of the amplifier is K, then the voltage of the amplifier output 403 in the first operation mode is $$Vout1=K*(V+-V-)=K*(Vos+(Vin/2)-(Vin*R2/(R1+R2)))$$

Additionally, the voltage of the amplifier output 403 in the second operation mode is $$Vout2=K*(V+-V-)=K*(Vos+(Vin/2)-(Vin*R1/(R1+R2)))$$

The subtracting result of the voltage of the amplifier output 403 generated in the first operation mode and the second operation mode (Vout1−Vout2) is $$Vout1 - Vout2 = K*(Vin*(R1-R2)/(R1+R2))$$
$$= 2*K*((Vin/2) - (Vin*R2/(R1+R2)))$$

The subtracting result cancels the voltage of the amplifier offset 404 (Vos), and the leakage current caused by the wire between the sensor 10 and the amplifier 40 is also compensated.

The adding result of the voltage of the amplifier output 403 generated in the first operation mode and the second operation mode (Vout1+Vout2) is $$Vout1+Vout2=K*(2*Vos+Vin-Vin)=2*K*Vos$$

The adding result cancels the input voltage (Vin), and depends on the voltage of the amplifier offset 404 (Vos) and the gain of the amplifier (K).

Figure 3:
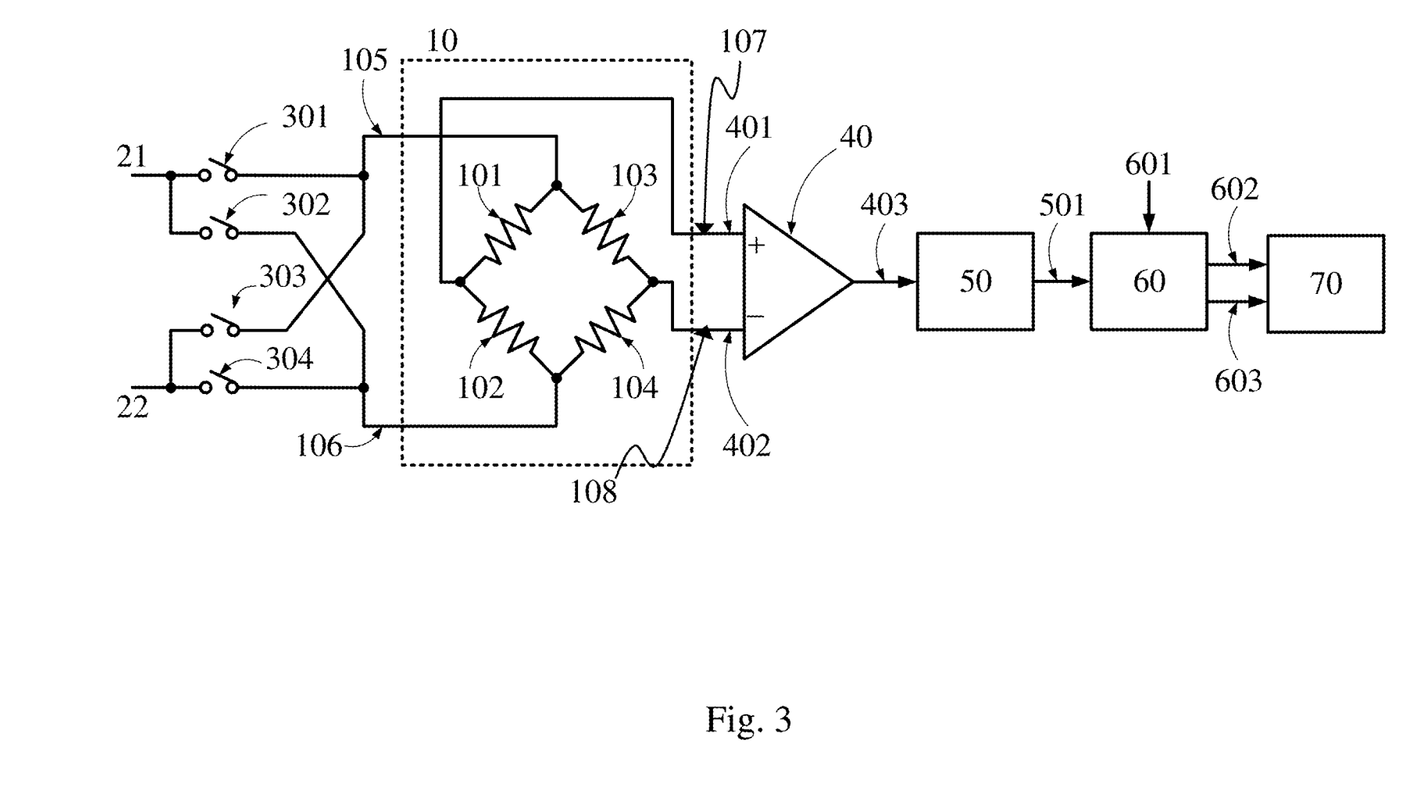
FIG. 3 illustrates an architecture comprising an analog-to-digital converter, a calculation circuit, and a display unit based on FIG. 1.

FIG. 3 illustrates an architecture comprising an analog-to-digital converter 50, a calculation circuit 60, and a display unit 70 based on the first embodiment. The analog-to-digital converter 50 converts the voltage of the amplifier output 403 to a digital data 501, and connects to the calculation circuit 60 for calculating the digital data 501 generated in the first operation mode and the second operation mode. In addition, an output data 602 is generated by subtracting the digital data 501 generated in the first operation mode and the second operation mode and divided by 2, or generated by the digital data 501 generated in the first operation mode.

In the above sensor with compensation circuit, if the first operation mode is affected by interference, and the output voltage of sensor exists a noise voltage (Vn), then the voltage of the amplifier output 403 is $$Vout1=K*(V+-V-)=K*(Vn+Vos+(Vin/2)-(Vin*R2/(R1+R2)))$$

If the second operation mode is not affected by interference, the voltage of the amplifier output 403 is $$Vout2=K*(V+-V-)=K*(Vos+(Vin/2)-(Vin*R1/(R1+R2)))$$

The adding result of the voltage of the amplifier output 403 generated in the first operation mode and the second operation mode (Vout1+Vout2) is $$Vout1+Vout2=K*(Vn+2*Vos+Vin-Vin)=2*K*Vos+(K*Vn)$$

The adding result (Vout1+Vout2) has one more item "K*Vn" than the normal result "2*K*Vos". Furthermore, the subtracting result of the voltage of the amplifier output 403 generated in the first operation mode and the second operation mode (Vout1−Vout2) cannot cancel the noise voltage (Vn), then the output data 602 is also affected.

Therefore, a noise threshold 601 (Vth) is set to check the circuit is affected by interference if the adding result (Vout1+Vout2) is larger than the noise threshold 601 (Vth), and the output data 602 is not updated, and keep the value when the circuit is not affected by interference.

In the above sensor with compensation circuit, wherein the noise threshold 601 (Vth) is a default value, or based on the adding result of the voltages of the amplifier output 403 generated in the first operation mode and the second operation mode (Vout1+Vout2). For example, the normal adding result (Vout1+Vout2) is "2*K*Vos", and an average value of the adding result (Vout1+Vout2) is calculated in a period, then the noise threshold 601 (Vth) is decided by the average value. Alternatively, find a maximum value of the adding result (Vout1+Vout2) in a period, then the noise threshold 601 (Vth) is decided by the maximum value.

The above sensor with compensation circuit further comprises a reminding signal 603, used to show the circuit is affected by interference when the adding result of the voltages of the amplifier output 403 generated in the first operation mode and the second operation mode (Vout1+Vout2) is larger than the noise threshold 601.

The above sensor with compensation circuit further comprises a display unit 70 for showing the output data 602. When the adding result of the voltages of the amplifier output 403 generated in the first operation mode and the second operation mode (Vout1+Vout2) is larger than the noise threshold 601, the output data 602 flickers on the display unit 70, or the reminding signal 603 is shown on the display unit 70 for representing the circuit is affected by interference.

Figure 4:
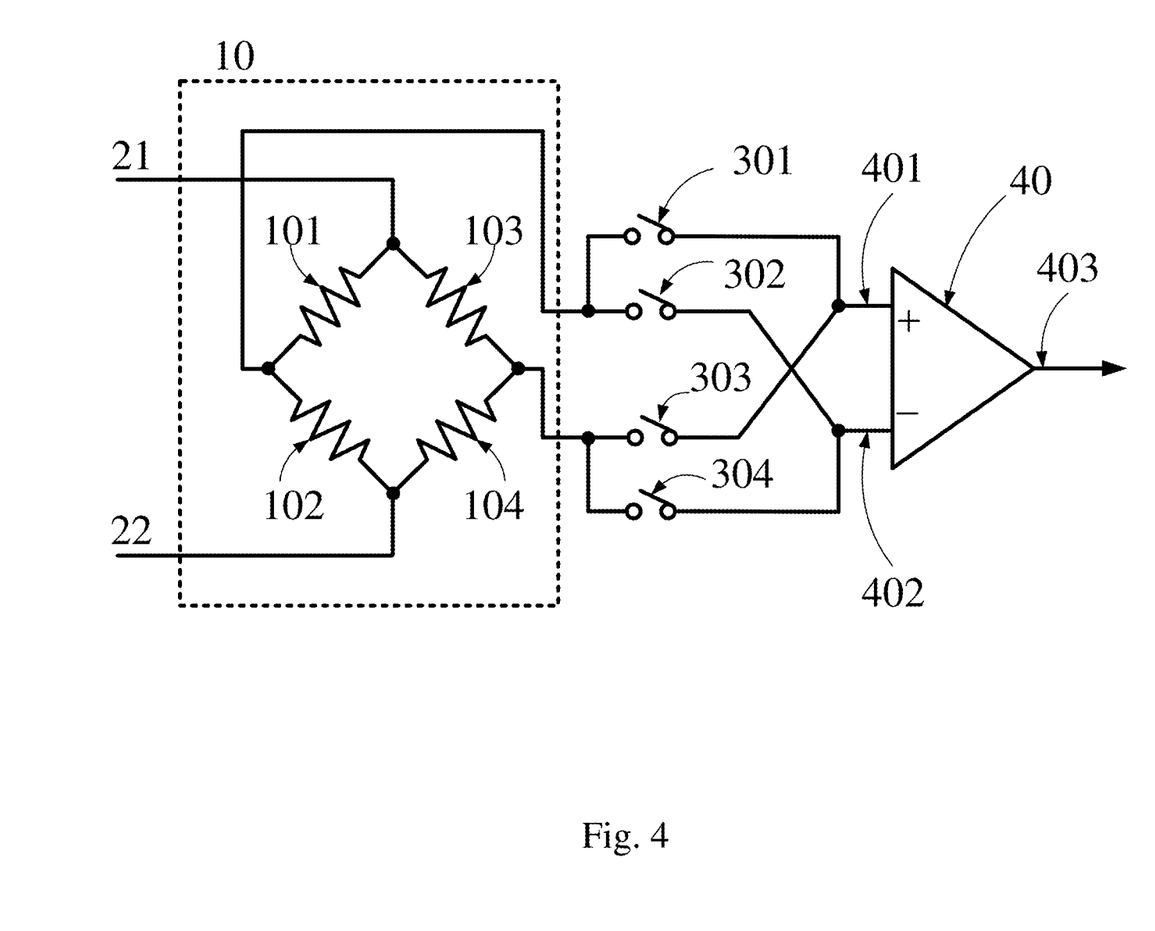
FIG. 4 illustrates another architecture of sensor with compensation circuit according to a second embodiment of the present invention.

A second embodiment of the present invention is disclosed in FIG. 3. It shows a sensor with compensation circuit. The sensor with compensation circuit comprises a sensor 10, four switches and an amplifier 40. The sensor 10 comprises a first input 105, a second input 106, a first output 107 and a second output 108. Wherein the first power source 21 connects to the first input 105 and the second power source 22 connects to the second input 106. The first switch 301 connects between the first output 107 and the positive amplifier input 401. The second switch 302 connects between the first output 107 and the negative amplifier input 402. The third switch 303 connects between the second output 108 and the positive amplifier input 401. The fourth switch 304 connects between the second output 108 and the negative amplifier input 402. In addition, the voltage of the amplifier output 403 is generated according to the voltage difference between the positive amplifier input 401 and the negative amplifier input 402 and multiplied by a gain.

For the sensor with compensation circuits mentioned above, wherein the sensor 10 is a bridge sensor comprising four resistors. Wherein the first resistor 101 connects between the first input 105 and the first output 107. The second resistor 102 connects between the second input 106 and the first output 107. The third resistor 103 connects between the first input 105 and the second output 108. The fourth resistor 104 connects between the second input 106 and the second output 108.

Figure 5A:
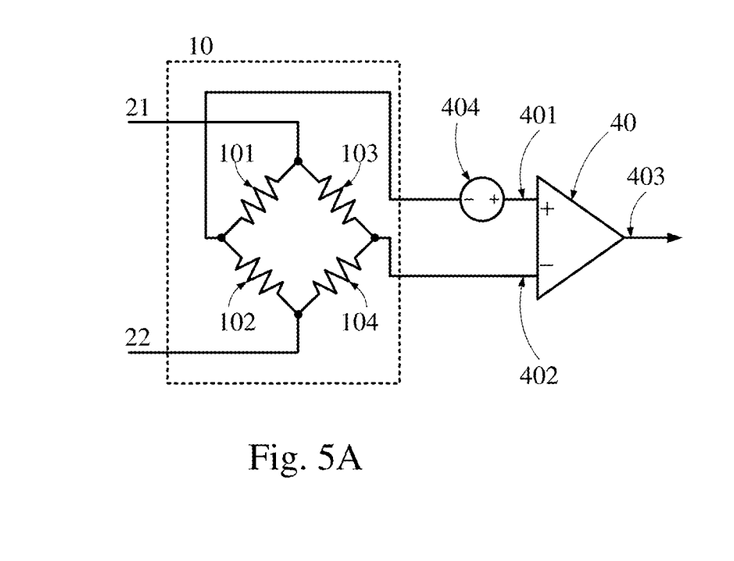
FIG. 5A and FIG. 5B illustrate an operation method for sensor with compensation circuit in FIG. 4.
Figure 5B:
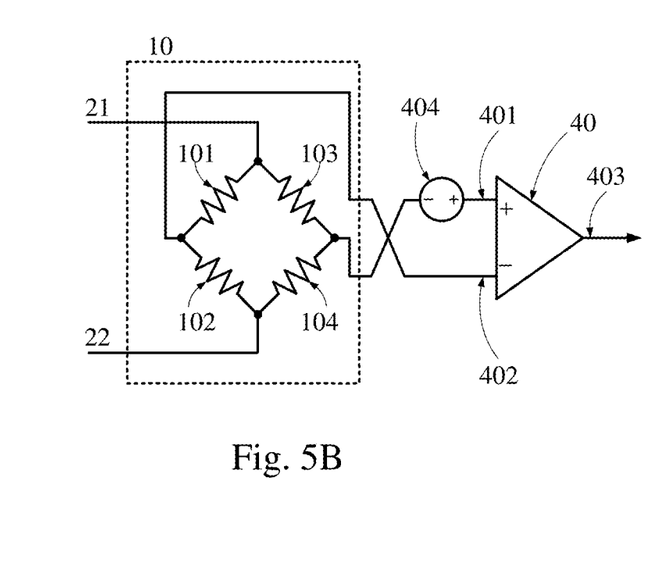

The sensor with compensation circuit comprises two operation modes: a first operation mode and a second operation mode. An equivalent circuit diagram of the first operation mode is shown in FIG. 5A. The first operation mode conducts the first switch 301 and the fourth switch 304, turns off the second switch 302 and the third switch 303. Hence, the first output 107 is connected to the positive amplifier input 401, and the second output 108 is connected to the negative amplifier input 402. An equivalent circuit diagram of the second operation mode of the sensor with compensation circuit is shown in FIG. 5B. The second operation mode conducts the second switch 302 and the third switch 303, turns off the first switch 301 and the fourth switch 304. Hence, the first output 107 is connected to the negative amplifier input 402, and the second output 108 is connected to the positive amplifier input 401.

Assuming the voltage difference of the first power source 21 and the second power source 22 is Vin, and the resistance of the first resister 101, the second resistor 102, and the third resistor 103 in the bridge sensor 10 is R1, and the resistance of the fourth resistor 104 is R2, the voltage of the amplifier offset 404 is Vos, the gain of the amplifier is K, then the voltage of the amplifier output 403 in the first operation mode is $$Vout1=K*(V+-V-)=K*(Vos+(Vin/2)-(Vin*R2/(R1+R2)))$$

Additionally, the voltage of the amplifier output 403 in the second operation mode is $$Vout2=K*(V+-V-)=K*(Vos-(Vin/2)+(Vin*R2/(R1+R2)))$$

The subtracting result of the voltage of the amplifier output 403 generated in the first operation mode and the second operation mode (Vout1−Vout2) is $$Vout1 - Vout2 = K*(Vin*(R1-R2)/(R1+R2))$$
$$= 2*K*((Vin/2)-(Vin*R2/(R1+R2)))$$

The subtracting result cancels the voltage of the amplifier offset 404 (Vos).

The adding result of the voltage of the amplifier output 403 generated in the first operation mode and the second operation mode (Vout1+Vout2) is $$Vout1+Vout2=K*(2*Vos)=2*K*Vos$$

The adding result (Vout1+Vout2) cancels the input voltage (Vin), and depends on the voltage of the amplifier offset 404 (Vos) and the gain of the amplifier (K).

Figure 6:
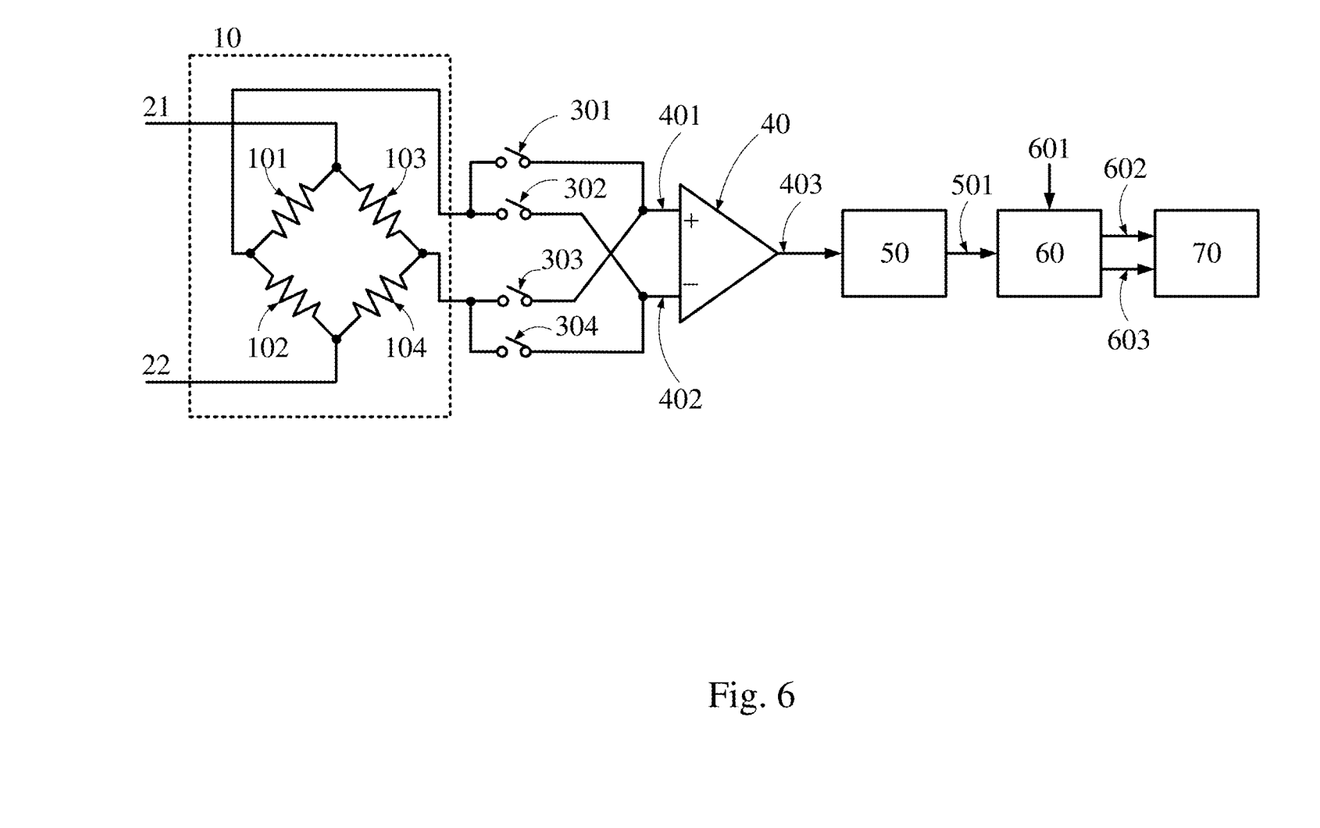
FIG. 6 illustrates an architecture comprising an analog-to-digital converter, a calculation circuit, and a display unit based on FIG. 4.

FIG. 6 illustrates an architecture comprising an analog-to-digital converter 50, a calculation circuit 60, and a display unit 70 based on the second embodiment. The analog-to-digital converter 50 converts the voltage of the amplifier output 403 to a digital data 501, and connects to the calculation circuit 60 for calculating the digital data 501 generated in the first operation mode and the second operation mode. In addition, an output data 602 is generated by subtracting the digital data 501 generated in the first operation mode and the second operation mode and divided by 2, or generated by the digital data 501 generated in the first operation mode.

In the above sensor with compensation circuit, if the first operation mode is affected by interference, and the output voltage of sensor exists a noise voltage (Vn), then the voltage of the amplifier output 403 is $$Vout1=K*(V+-V-)=K*(Vn+Vos+(Vin/2)-(Vin*R2/(R1+R2)))$$

If the second operation mode is not affected by interference, the voltage of the amplifier output 403 is $$Vout2=K*(V+-V-)=K*(Vos-(Vin/2)+(Vin*R2/(R1+R2)))$$

The adding result of the voltage of the amplifier output 403 generated in the first operation mode and the second operation mode (Vout1+Vout2) is $$Vout1+Vout2=K*(Vn+2*Vos)=2*K*Vos+(K*Vn)$$

The adding result (Vout1+Vout2) has one more item "K*Vn" than the normal result "2*K*Vos". Furthermore, the subtracting result of the voltage of the amplifier output 403 generated in the first operation mode and the second operation mode (Vout1−Vout2) cannot cancel the noise voltage (Vn), then the output data 602 is also affected.

Therefore, a noise threshold 601 (Vth) is set to check the circuit is affected by interference if the adding result (Vout1+Vout2) is larger than the noise threshold 601 (Vth), and the output data 602 is not updated, and keep the value when the circuit is not affected by interference.

In the above sensor with compensation circuit, wherein the noise threshold 601 (Vth) is a default value, or based on the adding result of the voltages of the amplifier output 403 generated in the first operation mode and the second operation mode (Vout1+Vout2). For example, the normal adding result (Vout1+Vout2) is "2*K*Vos", and an average value of the adding result (Vout1+Vout2) is calculated in a period, then the noise threshold 601 (Vth) is decided by the average value. Alternatively, find a maximum value of the adding result (Vout1+Vout2) in a period, then the noise threshold 601 (Vth) is decided by the maximum value.

The above sensor with compensation circuit further comprises a reminding signal 603, used to show the circuit is affected by interference when the adding result of the voltages of the amplifier output 403 generated in the first operation mode and the second operation mode (Vout1+Vout2) is larger than the noise threshold 601.

The above sensor with compensation circuit further comprises a display unit 70 for showing the output data 602. When the adding result of the voltages of the amplifier output 403 generated in the first operation mode and the second operation mode (Vout1+Vout2) is larger than the noise threshold 601, the output data 602 flickers on the display unit 70, or the reminding signal 603 is shown on the display unit 70 for representing the circuit is affected by interference.

Figure 7:
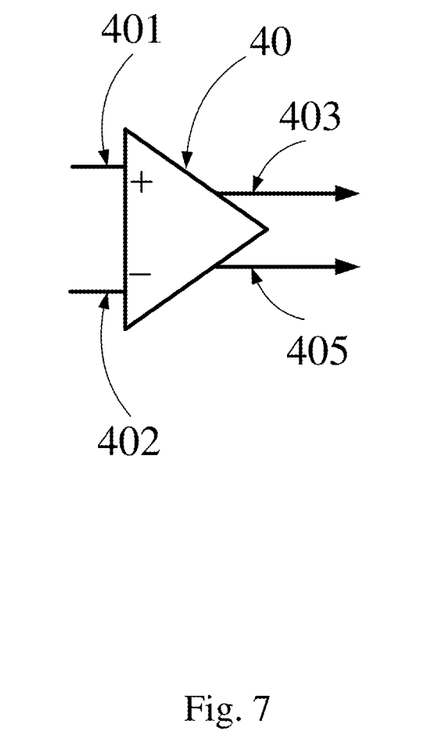
FIG. 7 illustrates another aspect of the amplifier according to the present invention.

According to the present invention, the voltage of amplifier output 403 equals to a voltage difference between the positive amplifier input 401 and the negative amplifier input 402, and multiplied by a gain (K). Mathematical expression is "VOUT+=K*(VIN+−VIN−)". In addition, please refer to FIG. 7. The amplifier 40 can further comprises a negative amplifier output 405. A voltage difference between the amplifier output 403 and the negative amplifier output 405 equals to a voltage difference between the positive amplifier input 401 and the negative amplifier input 402, multiplied by a gain (K). Mathematical expression is "VOUT+−VOUT−= K*(VIN+−VIN−)".

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims, which are to be accorded with the broadest interpretation so as to encompass all such modifications and similar structures.

What is claimed is:

1. A sensor with compensation circuit, comprising:
    a sensor, including a first input, a second input, a first output and a second output;
    a first switch, connected between a first power source and the first input;
    a second switch, connected between the first power source and the second input;
    a third switch, connected between a second power source and the first input;
    a fourth switch, connected between the second power source and the second input; and
    an amplifier, having a positive amplifier input and a negative amplifier input, separately connected to the first output and the second output, wherein the voltage of an amplifier output is generated according to the voltage difference between the positive amplifier input and the negative amplifier input and multiplied by a gain,
    wherein a control method for the switches comprising:
    a first operation mode, conducting the first switch and the fourth switch, turning off the second switch and the third switch, thereby connecting the first power source to the first input and connecting the second power source to the second input; and
    a second operation mode, conducting the second switch and the third switch, turning off the first switch and the fourth switch, thereby connecting the first power source to the second input and connecting the second power source to the first input; subtracting the voltages generated at the amplifier output during the first operation mode and the second operation mode to eliminate offset of the amplifier.

2. The sensor with compensation circuit according to claim 1, further comprising an analog-to-digital converter, for converting the voltage of the amplifier output into a digital data; and a calculation circuit, for calculating the digital data generated in the first operation mode and the second operation mode, for generating an output data by subtracting the voltages of the amplifier output generated in the first operation mode and the second operation mode and then divide the difference by 2, or for generating an output data according to the voltage of the amplifier output generated in the first operation mode.

3. The sensor with compensation circuit according to claim 1, wherein the sensor is a bridge sensor which includes four resistors, a first resistor is connected between the first input and the first output, a second resistor is connected between the second input and the first output, a third resistor is connected between the first input and the second output, a fourth resistor is connected between the second input and the second output.

4. The sensor with compensation circuit according to claim 1, wherein a control method for the switches comprising:
    a first operation mode, conducting the first switch and the fourth switch, turning off the second switch and the third switch, thereby connecting the first power source to the first input and connecting the second power source to the second input; and
    a second operation mode, conducting the second switch and the third switch, turning off the first switch and the fourth switch, thereby connecting the first power source to the second input and connecting the second power source to the first input; adding the voltages generated at the amplifier output during the first operation mode and the second operation mode to calculate offset of the amplifier.

5. The sensor with compensation circuit according to claim 4, further comprising an analog-to-digital converter, for converting the voltage of the amplifier output into a digital data; and a calculation circuit, for calculating the digital data generated in the first operation mode and the second operation mode, for generating an output data by subtracting the voltages of the amplifier output generated in the first operation mode and the second operation mode and then divide the difference by 2, or for generating an output data according to the voltage of the amplifier output generated in the first operation mode.

6. The sensor with compensation circuit according to claim 5, wherein the output data is hold and not updated while the total voltage of the amplifier output generated in the first operation mode and second operation mode is larger than a noise threshold.

7. The sensor with compensation circuit according to claim 6, wherein the noise threshold is a default value or a value based on the total voltage of the amplifier output generated in the first operation mode and the second operation mode.

8. The sensor with compensation circuit according to claim 4, wherein the sensor is a bridge sensor which includes four resistors, a first resistor is connected between the first input and the first output, a second resistor is connected between the second input and the first output, a third resistor is connected between the first input and the second output, a fourth resistor is connected between the second input and the second output.

9. The sensor with compensation circuit according to claim 4, wherein a reminding signal is issued to indicate that the circuit is affected by interference while the total voltage of the amplifier output generated in the first operation mode and second operation mode is larger than a noise threshold.

10. The sensor with compensation circuit according to claim 4, further comprising a display unit, for displaying the output data, and indicating that the circuit is affected by interference by flickering the output data on the display unit or showing a reminding signal on the display unit while the total voltage of the amplifier output generated in the first operation mode and second operation mode is larger than a noise threshold.

11. The sensor with compensation circuit according to claim 1, further comprising an analog-to-digital converter, for converting the voltage of the amplifier output into a digital data; and a calculation circuit, for calculating the digital data and generating an output data.

12. The sensor with compensation circuit according to claim 1, wherein the sensor is a bridge sensor which includes four resistors, a first resistor is connected between the first input and the first output, a second resistor is connected between the second input and the first output, a third resistor is connected between the first input and the second output, a fourth resistor is connected between the second input and the second output.

13. A sensor with compensation circuit, comprising:
a sensor, having a first input, a second input, a first output and a second output, wherein the first input is connected to a first power source and the second input is connected to a second power source;
an amplifier, having a positive amplifier input, a negative amplifier input, and an amplifier output, the voltage of the amplifier output is generated according to the voltage difference between the positive amplifier input and the negative amplifier input and multiplied by a gain;
a first switch, connected between the first output and the positive amplifier input;
a second switch, connected between the first output and the negative amplifier input;
a third switch, connected between the second output and the positive amplifier input; and
a fourth switch, connected between the second output and the negative amplifier input,
wherein a control method for the switches comprising:
a first operation mode, conducting the first switch and the fourth switch, turning off the second switch and the third switch, thereby connecting the first output to the positive amplifier input and connecting the second output to the negative amplifier input; and
a second operation mode, conducting the second switch and the third switch, turning off the first switch and the fourth switch, thereby connecting the first output to the negative amplifier input and connecting the second output to the positive amplifier input; subtracting the voltages generated at the amplifier output during the first operation mode and the second operation mode to eliminate offset of the amplifier.

14. The sensor with compensation circuit according to claim 13, further comprising an analog-to-digital converter, for converting the voltage of the amplifier output into a digital data; and a calculation circuit, for calculating the digital data generated in the first operation mode and the second operation mode, for generating an output data by subtracting the voltages of the amplifier output generated in the first operation mode and the second operation mode and then divide the difference by 2, or for generating an output data according to the voltage of the amplifier output generated in the first operation mode.

15. The sensor with compensation circuit according to claim 13, wherein the sensor is a bridge sensor which includes four resistors, a first resistor is connected between the first input and the first output, a second resistor is connected between the second input and the first output, a third resistor is connected between the first input and the second output, a fourth resistor is connected between the second input and the second output.

16. The sensor with compensation circuit according to claim 13, wherein a control method for the switches comprising:
a first operation mode, conducting the first switch and the fourth switch, turning off the second switch and the third switch, thereby connecting the first output to the positive amplifier input and connecting the second output to the negative amplifier input; and
a second operation mode, conducting the second switch and the third switch, turning off the first switch and the fourth switch, thereby connecting the first output to the negative amplifier input and connecting the second output to the positive amplifier input; adding the voltages generated at the amplifier output during the first operation mode and the second operation mode to calculate offset of the amplifier.

17. The sensor with compensation circuit according to claim 16, further comprising an analog-to-digital converter, for converting the voltage of the amplifier output into a digital data; and a calculation circuit, for calculating the digital data generated in the first operation mode and the second operation mode, for generating an output data by subtracting the voltages of the amplifier output generated in the first operation mode and the second operation mode and then divide the difference by 2, or for generating an output data according to the voltage of the amplifier output generated in the first operation mode.

18. The sensor with compensation circuit according to claim 17, wherein the output data is hold and not updated while the total voltage of the amplifier output generated in the first operation mode and second operation mode is larger than a noise threshold.

19. The sensor with compensation circuit according to claim 18, wherein a reminding signal is issued to indicate that the circuit is affected by interference while the total voltage of the amplifier output generated in the first operation mode and second operation mode is larger than a noise threshold.

20. The sensor with compensation circuit according to claim 16, wherein the noise threshold is a default value or a value based on the total voltage of the amplifier output generated in the first operation mode and the second operation mode.

21. The sensor with compensation circuit according to claim 16, further comprising a display unit, for displaying the output data, and indicating that the circuit is affected by interference by flickering the output data on the display unit or showing a reminding signal on the display unit while the total voltage of the amplifier output generated in the first operation mode and second operation mode is larger than a noise threshold.

22. The sensor with compensation circuit according to claim 16, wherein the sensor is a bridge sensor which includes four resistors, a first resistor is connected between the first input and the first output, a second resistor is connected between the second input and the first output, a third resistor is connected between the first input and the second output, a fourth resistor is connected between the second input and the second output.

23. The sensor with compensation circuit according to claim 13, further comprising an analog-to-digital converter, for converting the voltage of the amplifier output into a digital data; and a calculation circuit, for calculating the digital data and generating an output data.

24. The sensor with compensation circuit according to claim 13, wherein the sensor is a bridge sensor which includes four resistors, a first resistor is connected between the first input and the first output, a second resistor is connected between the second input and the first output, a third resistor is connected between the first input and the second output, a fourth resistor is connected between the second input and the second output.

\* \* \* \* \*